(12) United States Patent
Zhou et al.

(10) Patent No.: US 9,733,741 B2
(45) Date of Patent: Aug. 15, 2017

(54) ARRAY SUBSTRATE, TOUCH DISPLAY PANEL AND TOUCH DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Xingyao Zhou, Shanghai (CN); Qijun Yao, Shanghai (CN); Lingxiao Du, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/788,688

(22) Filed: Jun. 30, 2015

(65) Prior Publication Data

US 2016/0291749 A1   Oct. 6, 2016

(30) Foreign Application Priority Data

Apr. 1, 2015   (CN) .......................... 2015 1 0152834

(51) Int. Cl.
*G06F 3/041*      (2006.01)
*G06F 3/044*      (2006.01)
(Continued)

(52) U.S. Cl.
CPC ............ *G06F 3/0412* (2013.01); *G06F 3/044* (2013.01); *G02F 1/13338* (2013.01);
(Continued)

(58) Field of Classification Search
CPC ........ G06F 3/044; G06F 3/0412; G06F 3/041; G06F 3/0488; G06F 2203/04103;
(Continued)

(56) References Cited

U.S. PATENT DOCUMENTS 9,250,735 B2 *   2/2016   Kim .................... G06F 3/0412
2013/0162570 A1 *   6/2013   Shin ........................ G06F 3/041
345/173

(Continued)

FOREIGN PATENT DOCUMENTS

CN   104021912 A   9/2014

*Primary Examiner* — Sanjiv D Patel
(74) *Attorney, Agent, or Firm* — Alston & Bird LLP (57) ABSTRACT

One inventive aspect is an array substrate. The array substrate includes a plurality of touch leads, a common electrode layer, and a drive circuit. The common electrode layer is divided into a plurality of self-capacitive electrodes, and the self-capacitive electrodes are electronically connected to the drive circuit through the touch leads. The array substrate also includes a plurality of pixel units. Each touch lead is electronically connected to the self-capacitive electrode corresponding to the touch lead via a first via hole. At least one touch lead is continuous and passes through a whole column of the self-capacitive electrodes. In a direction perpendicular to the array substrate, a projection of the self-capacitive electrode covers projections of a plurality of pixel units. In addition, along a direction of the touch leads, an interval between two adjacent first via holes is greater than or equal to a length of two pixel units.

12 Claims, 9 Drawing Sheets

(51) Int. Cl.
G02F 1/1343 (2006.01)
H05K 1/11 (2006.01)
G02F 1/1333 (2006.01)

(52) U.S. Cl.
CPC ............ *G02F 2001/134318* (2013.01); *G06F 2203/04111* (2013.01); *G09G 2300/0426* (2013.01); *H05K 1/115* (2013.01)

(58) Field of Classification Search
CPC ..... G02F 1/13338; G02F 2001/134318; G02F 1/136227; G09G 2300/0426
See application file for complete search history.

(56) References Cited

U.S. PATENT DOCUMENTS

| | | | |
|---|---|---|---|
| 2013/0271715 A1* | 10/2013 | Kawashima | G02F 1/134336 349/143 |
| 2013/0342478 A1* | 12/2013 | Bae | G06F 3/041 345/173 |
| 2014/0118277 A1* | 5/2014 | Kim | G06F 3/044 345/173 |
| 2015/0084912 A1* | 3/2015 | Seo | G06F 3/0412 345/174 |
| 2015/0338951 A1* | 11/2015 | Lee | G06F 3/044 345/174 |
| 2016/0011687 A1* | 1/2016 | Ding | G06F 3/044 345/174 |
| 2016/0026291 A1* | 1/2016 | Zhao | G06F 3/044 345/174 |

\* cited by examiner

ARRAY SUBSTRATE, TOUCH DISPLAY PANEL AND TOUCH DISPLAY DEVICE

This application claims the benefit of priority to Chinese Patent Application No. 201510152834.9, filed with the Chinese Patent Office on Apr. 1, 2015 and entitled "ARRAY SUBSTRATE, TOUCH DISPLAY PANEL AND TOUCH DISPLAY DEVICE", the content of which is incorporated herein by reference in its entirety.

FIELD OF THE INVENTION

The disclosure generally relates to the field of touch technique, and in particular to an array substrate, a touch display panel and a touch display device.

BACKGROUND OF THE INVENTION

Capacitive touch panels can be classified into two types, i.e., self-capacitive and mutual capacitive based on detection method of the capacitor. Touch display devices can be classified into three types, i.e., in-cell, on-cell and out-cell based on relative position of panels, touch panels and display panels. The in-cell touch panel has become an important development trend in touch technology due to its advantages of high integration, thin profile and prominent performance, etc.

Currently, existing touch display devices mainly employ in-cell mutual capacitive touch technology. However, there are problems such as poor waterproof property, low report rate, and poor suspension property in the in-cell mutual capacitive touch technology, and two separate drive circuits are respectively required for electrodes of the display panel and touch electrodes of the touch panel in the touch display device, thereby a cost of the touch display device is high.

Based on this, it has also been provided an in-cell self-capacitive touch technology according to the conventional art to solve the problems of high cost, poor waterproof property, low report rate, and poor suspension property in the in-cell mutual capacitive touch technology. According to the in-cell self-capacitive touch technology, a common electrode layer on the array substrate is also used as touch electrodes, and the touch electrodes are connected to a drive circuit of the array substrate through touch leads. However, via holes via which the touch leads are electronically connected to the touch electrodes may cause a problem such as visible streaks in screen display.

BRIEF SUMMARY OF THE INVENTION

One inventive aspect is an array substrate. The array substrate includes a plurality of touch leads, a common electrode layer, and a drive circuit, where the common electrode layer is divided into a plurality of self-capacitive electrodes, and where the self-capacitive electrodes are electronically connected to the drive circuit through the touch leads. The array substrate also includes a plurality of pixel units. Each touch lead is electronically connected to the self-capacitive electrode corresponding to the touch lead via a first via hole. At least one of the touch leads is continuous and passes through a whole column of the self-capacitive electrodes. In a direction perpendicular to the array substrate, a projection of the self-capacitive electrode covers projections of a plurality of pixel units. In addition, along a direction of the touch leads, an interval between two adjacent first via holes is greater than or equal to a length of two pixel units.

Another inventive aspect is a touch display panel including an array substrate. The array substrate includes a plurality of touch leads, a common electrode layer, and a drive circuit, where the common electrode layer is divided into a plurality of self-capacitive electrodes, and where the self-capacitive electrodes are electronically connected to the drive circuit through the touch leads. The array substrate also includes a plurality of pixel units. Each touch lead is electronically connected to the self-capacitive electrode corresponding to the touch lead via a first via hole. At least one of the touch leads is continuous and passes through a whole column of the self-capacitive electrodes. In a direction perpendicular to the array substrate, a projection of the self-capacitive electrode covers projections of a plurality of pixel units. In addition, along a direction of the touch leads, an interval between two adjacent first via holes is greater than or equal to a length of two pixel units.

Another inventive aspect is a touch display device including a touch display panel including an array substrate. The array substrate includes a plurality of touch leads, a common electrode layer, and a drive circuit, where the common electrode layer is divided into a plurality of self-capacitive electrodes, and where the self-capacitive electrodes are electronically connected to the drive circuit through the touch leads. The array substrate also includes a plurality of pixel units. Each touch lead is electronically connected to the self-capacitive electrode corresponding to the touch lead via a first via hole. At least one of the touch leads is continuous and passes through a whole column of the self-capacitive electrodes. In a direction perpendicular to the array substrate, a projection of the self-capacitive electrode covers projections of a plurality of pixel units. In addition, along a direction of the touch leads, an interval between two adjacent first via holes is greater than or equal to a length of two pixel units.

BRIEF DESCRIPTION OF THE DRAWINGS

Drawings to be used in description of embodiments or the prior art are described briefly as follows, so that the technical solutions according to the embodiments of the present invention or according to the prior art become more clear. It is apparent that the drawings in the following description are merely a few embodiments of the present invention. For those skilled in the art, other drawings may be obtained based on these drawings without any creative work.

DETAILED DESCRIPTION OF THE INVENTION

The technical solutions according to the embodiments of the present invention are described clearly and completely as follows in conjunction with the drawings in the embodiments of the present invention. Apparently the described embodiments are merely a few embodiments according to the present invention. All the other embodiments obtained by those skilled in the art based on the embodiments in the present invention and without any creative work belong to the scope of protection of the present invention.

Figure 1:
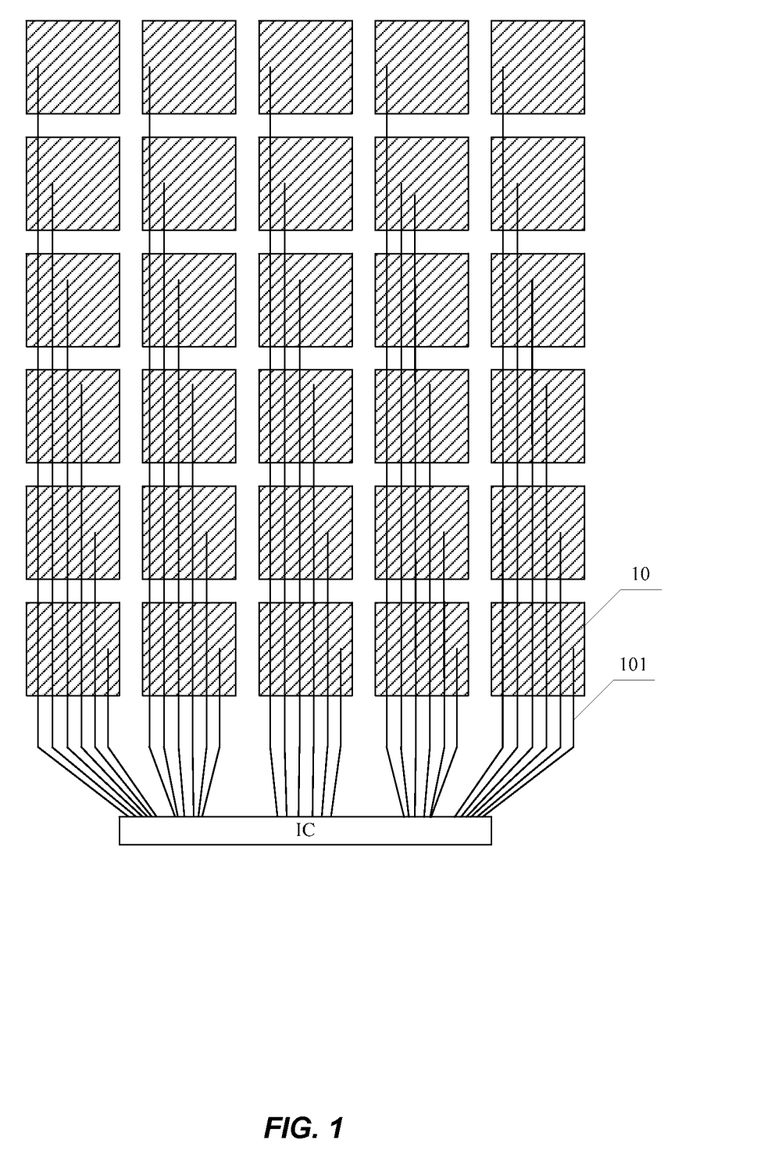
FIG. 1 is a schematic top view of a structure of an array substrate according to an embodiment of the disclosure.

It is provided an array substrate according to an embodiment of the disclosure. The array substrate includes a common electrode layer and a drive circuit IC. The common electrode layer is divided into multiple block shaped self-capacitive electrodes 10 insulated from each other. The self-capacitive electrodes 10 are electronically connected to the drive circuit IC through touch leads 101. FIG. 1 is a top view of the array substrate.

Figure 2:
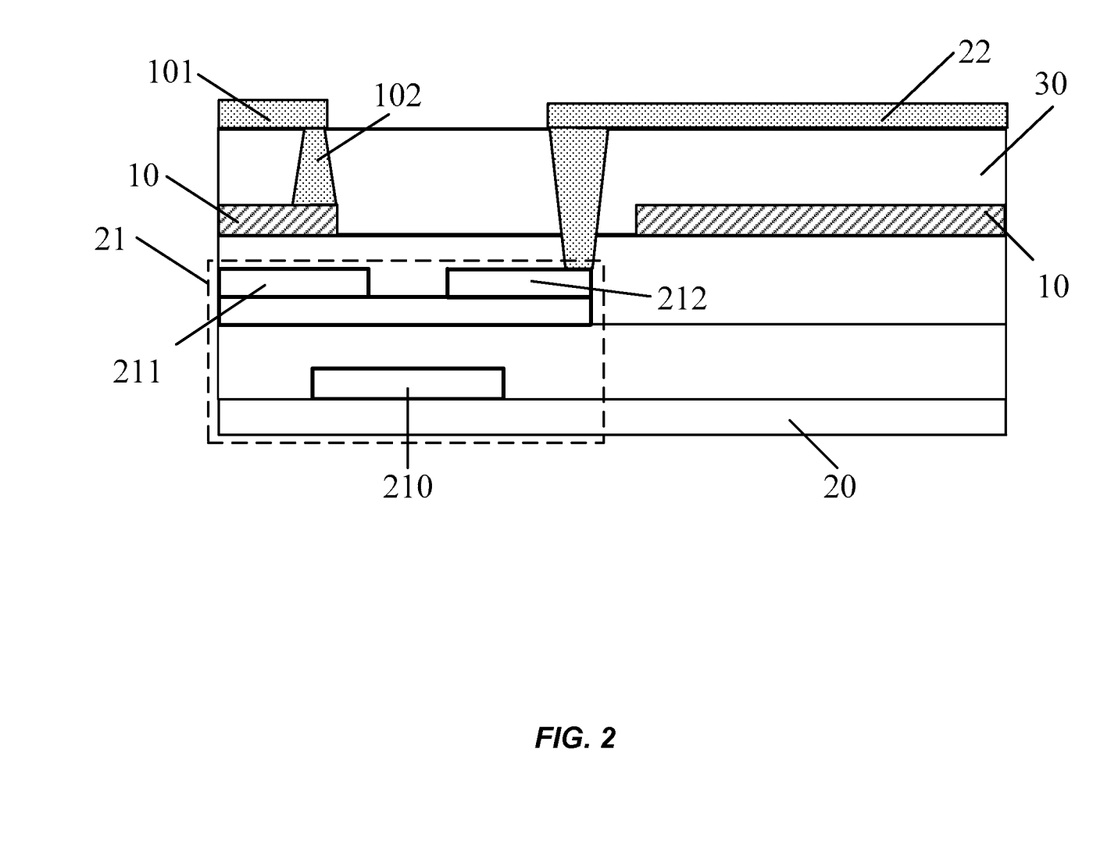
FIG. 2 is a schematic section view of a structure of an array substrate according to an embodiment of the disclosure.
Figure 3:
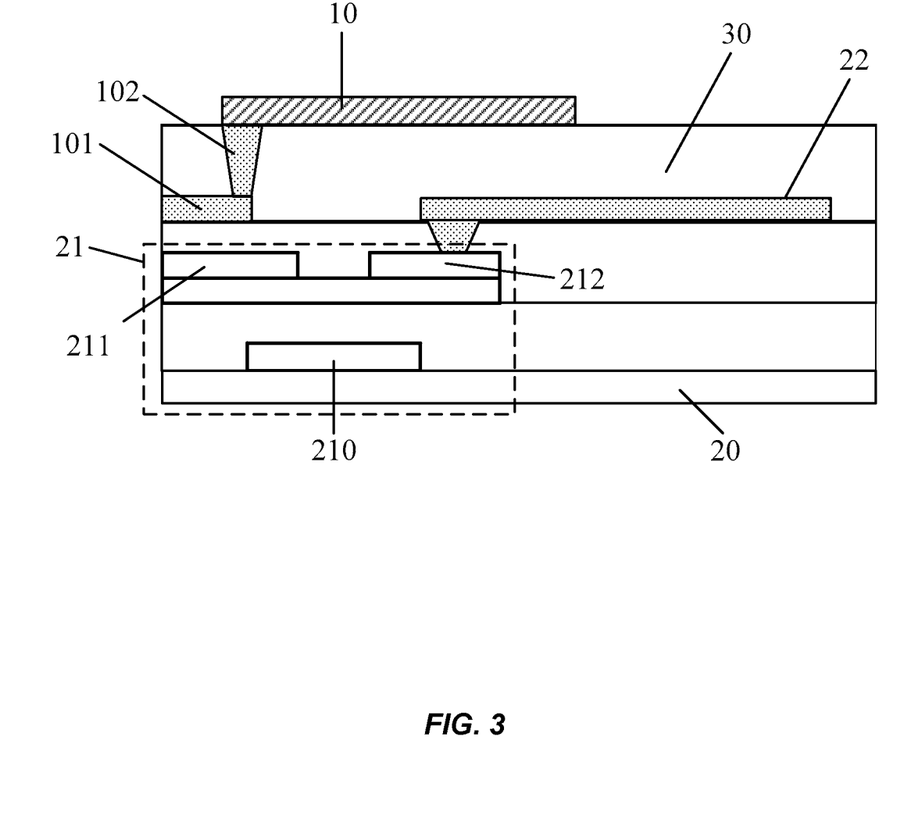
FIG. 3 is a schematic section view of a structure of another array substrate according to an embodiment of the disclosure.

As shown in FIG. 2 and FIG. 3, the array substrate according to the embodiment further includes: a glass substrate 20, multiple gate lines and multiple data lines on the glass substrate 20 and multiple pixel units (not shown) surrounded by the gate lines and the data lines. In a direction perpendicular to the array substrate, a projection of the block shaped self-capacitive electrode 10 covers a projection of multiple pixel units. The number of the pixel units whose projections are covered by the projection of the block shaped self-capacitive electrode 10 is set as desired, which is not further described herein. The pixel unit includes thin film transistor 21 and a pixel electrode 22. A gate 210 of the thin film transistor 21 is electronically connected to the gate line. A source 211 of the thin film transistor 21 is electronically connected to the data line. And a drain 212 of the thin film transistor 21 is electronically connected to the pixel electrode 22.

In the array substrate, the common electrode layer i.e. the self-capacitive electrode 10 is between the thin film transistor 21 and the pixel electrode 22. And an insulating layer 30 is between the common electrode layer i.e. the self-capacitive electrode 10 and the pixel electrode 22. FIG. 2 is a schematic section view of the structure of the array substrate. Optionally, in other embodiments of the present disclosure, as shown in FIG. 3, the pixel electrode 22 is between the thin film transistor 21 and the common electrode layer i.e. the self-capacitive electrode 10, and an insulating layer 30 is between the common electrode layer i.e. the self-capacitive electrode 10 and the pixel electrode 22. Optionally, the touch leads 101 are in a same layer with the pixel electrode 22. Certainly, the present disclosure is not limited thereto.

Figure 4:
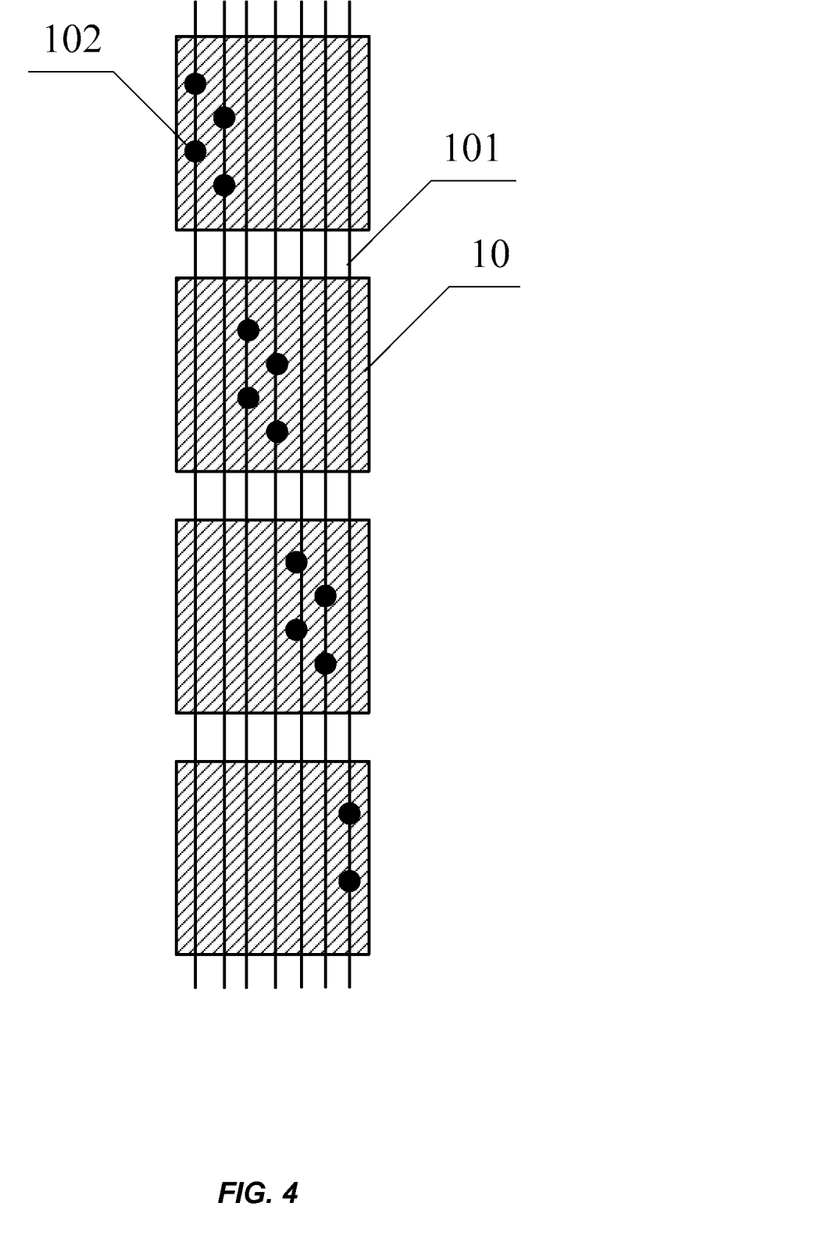
FIG. 4 is a schematic distribution diagram of first via holes in an array substrate according to an embodiment of the disclosure.
Figure 5:
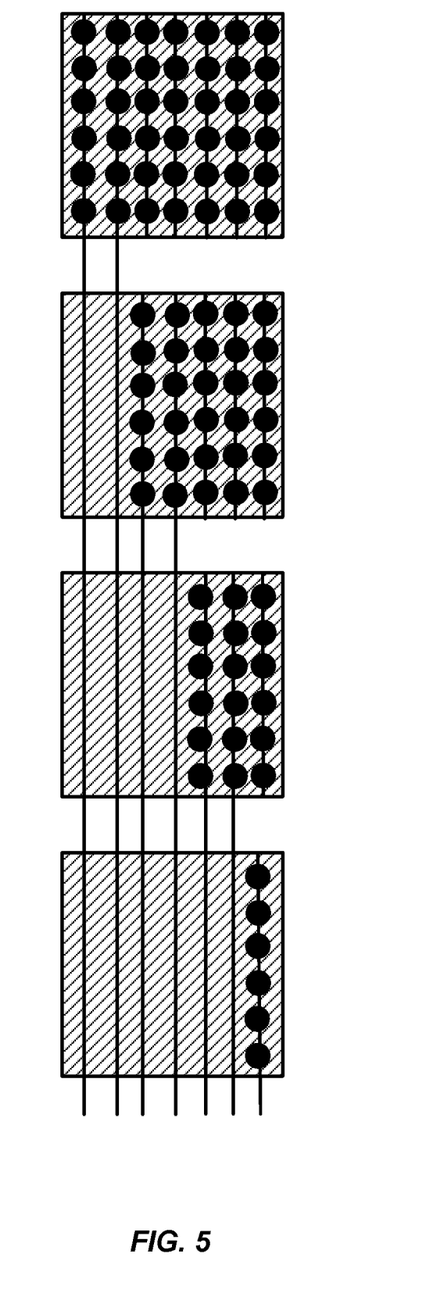
FIG. 5 is a schematic distribution diagram of first via holes in an array substrate according to the conventional art.

As shown in FIG. 2 and FIG. 3, the touch lead 101 is electronically connected to a self-capacitive electrode 10 corresponding to the touch lead 101 via a first via hole 102. As shown in FIG. 4, in the embodiment, at least one of the touch leads 101 is continuous and passes through all self-capacitive electrodes 10 along the direction of the touch leads 101, that is, a whole column of the self-capacitive electrodes 10. Optionally, all the touch leads 101 are continuous and pass through the whole column of the self-capacitive electrodes 10. The advantageous effects of above disposal are described below. In the case that a touch leads 101 is discontinuous, multiple via holes has to be disposed between the touch lead 101 and the self-capacitive electrodes 10 to electronically connect each segment of the touch lead 101 and the self-capacitive electrodes 10, and hence, too many via holes are disposed. Optionally, at least two touch leads passing through a whole column of the self-capacitive electrodes 10 are included corresponding to each column of the self-capacitive electrodes 10. In the conventional art, only one touch lead passing through a whole column of the self-capacitive electrodes 10 is included corresponding to each column of the self-capacitive electrodes 10. According to the array substrate provided here, the number of the via holes is decreased, and the problem that streaks visible to human eyes occurs in screen display is solved or alleviated. Optionally, along the direction of the touch leads, an interval between two adjacent first via holes is greater than or equal to the length of two pixel units. Optionally, in a direction perpendicular to the array substrate, a projection of two adjacent first via holes 102 electronically connected to the same touch lead 101 is separated by the projection of at least two pixel units. That is, along a direction in which the touch lead 101 extends, two adjacent first via holes 102 are separated by at least two pixel units. Compared with the scheme in the conventional art in which each pixel unit has one first via hole as shown in FIG. 5, in the array substrate according to the embodiment of the disclosure, the problem that streaks visible to human eyes occurs in screen display due to a large number or high density of the first via holes 102 is solved by decreasing the number and density of the first via holes 102.

Figure 6A:
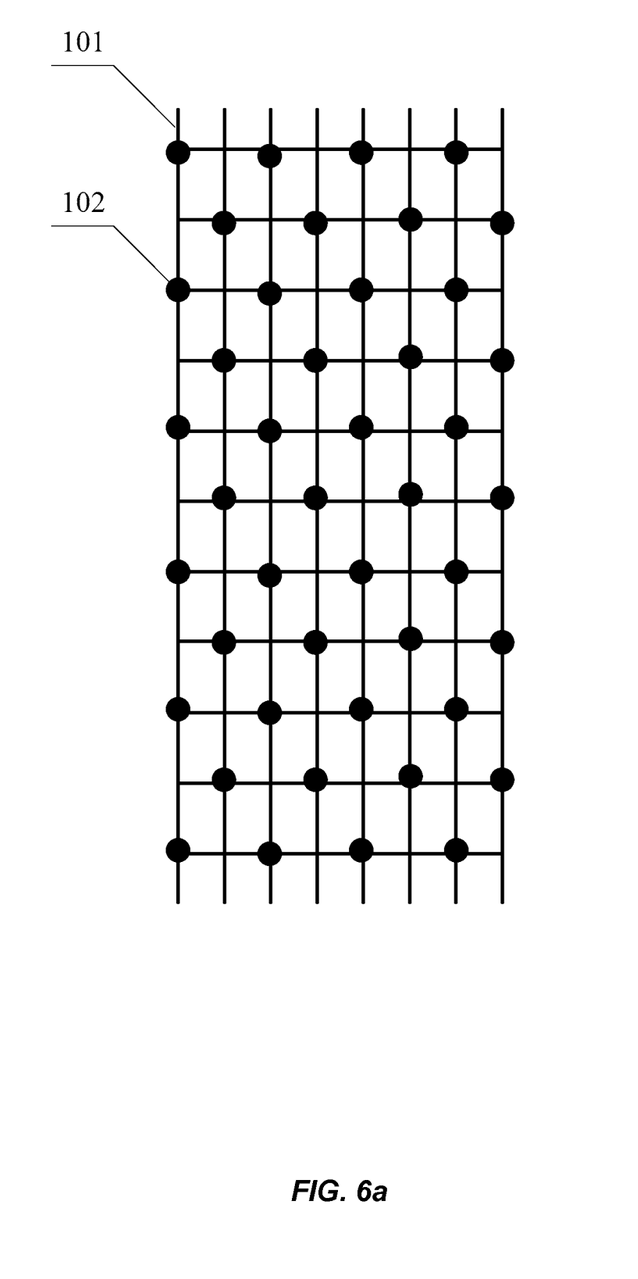
FIG. 6a is a schematic structural diagram in which the first via holes are separated by two pixel units.
Figure 6B:
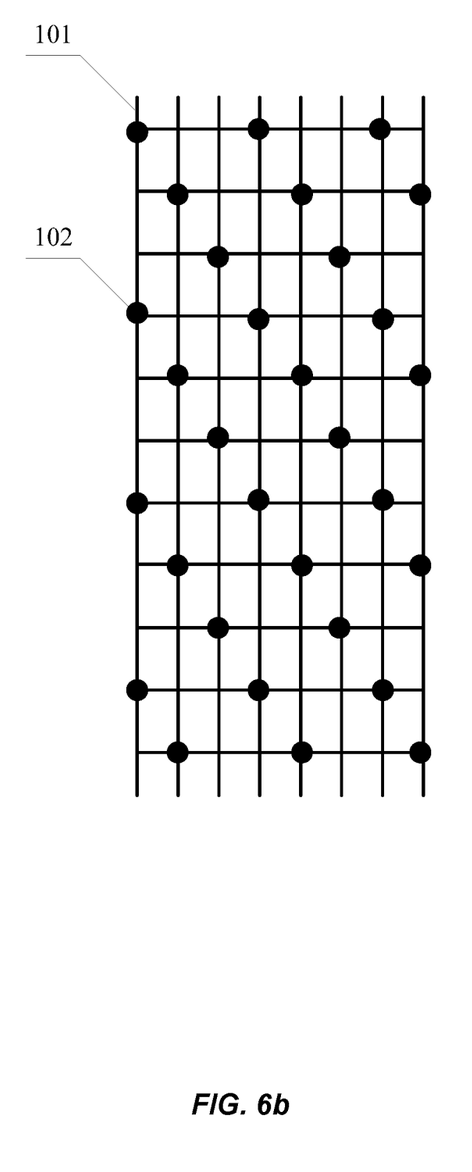
FIG. 6b is a schematic structural diagram in which the first via holes are separated by three pixel units.
Figure 6C:
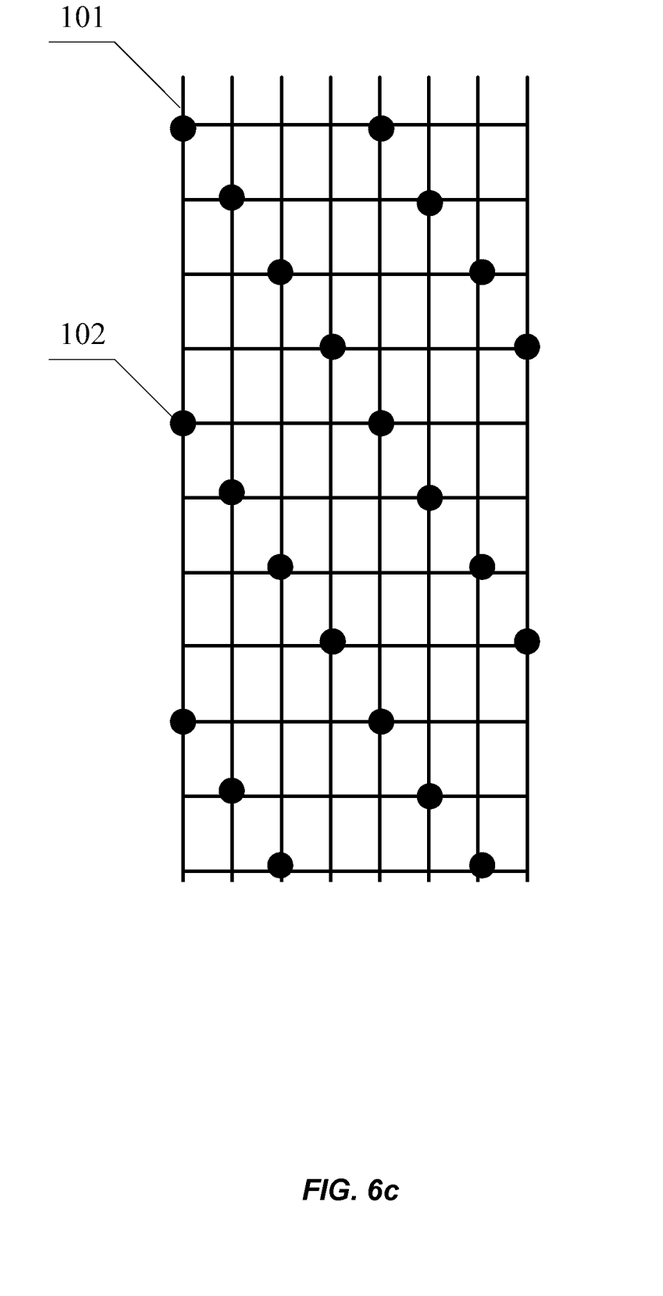
FIG. 6c is a schematic structural diagram in which the first via holes are separated by four pixel units.

As shown in FIG. 6a to FIG. 6c, each grid represents one pixel unit. As shown in FIG. 6a, in a direction parallel to the touch leads 101, two adjacent first via holes 102 along the same touch lead 101 are separated by two pixel units. As shown in FIG. 6b, in the direction along the touch leads 101, two adjacent first via holes 102 corresponding to the same touch lead 101 are separated by three pixel units. And as shown in FIG. 6c, in the direction along the touch leads 101, two adjacent first via holes 102 corresponding to the same touch lead 101 are separated by four pixel units.

Further, the greater the number of the pixel units between two adjacent first via holes 102 is, the lower the density of the first via holes 102 is. However, the number of the pixel units between the two adjacent first via holes 102 is preferably eight by considering manufacture process and other factors. That is, in the direction perpendicular to the array substrate, the projection of two adjacent first via holes 102 electronically connected to the same touch lead 101 is separated by the projection of eight pixel units, i.e., two adjacent first via holes 102 along the direction in which the touch leads 101 extends are separated by eight pixel units, thereby the number and density of the first via holes 102 are further decreased.

As shown in FIG. 4, the first via holes 102 corresponding to two adjacent touch leads 101 are staggered. That is, a first via hole 102 corresponding to one touch lead 101 is between two adjacent first via holes 102 corresponding to another touch lead 101 adjacent to the one touch lead 101. Hence, the uniformity of a distribution of the first via holes 102 is improved, and the problem streaks visible to human eyes occurs in screen display is avoided.

According to the array substrate provided in the embodiment, the touch lead is electronically connected to the self-capacitive electrodes corresponding to the touch lead via the first via hole, at least one of the touch leads is continuous and passes through the common electrode layer, and in the direction perpendicular to the array substrate the projection of two adjacent first via holes electronically connected to the same touch lead is separated by the projection of at least two pixel units. In this way, the problem that streaks or black spots visible to human eyes occurs in screen display due to a large number or high density of the first via holes is solved by decreasing the number and density of the first via holes.

Figure 7:
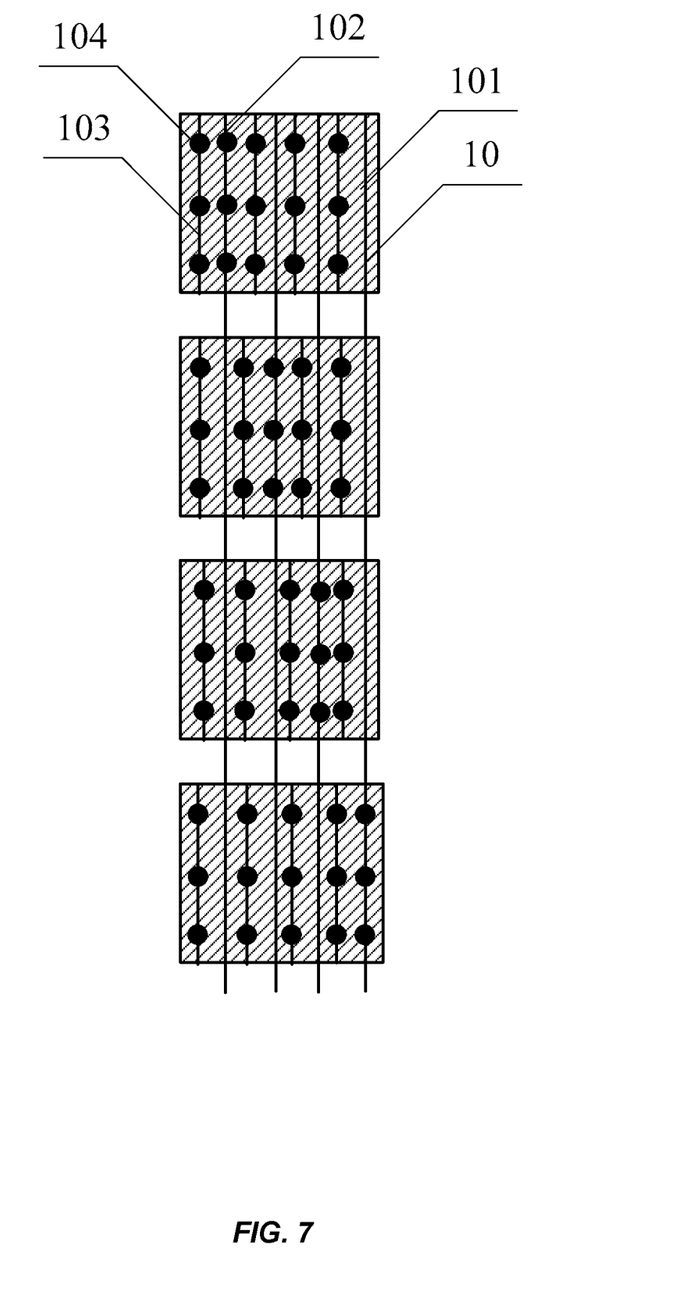
FIG. 7 is a schematic distribution diagram of first via holes and second via holes in an array substrate according to another embodiment of the disclosure.

Besides the above touch leads 101 and the first via holes 102 separated by at least two pixel units, an array substrate according to another embodiment of the disclosure further includes an auxiliary electrode line 103. The auxiliary electrode line 103 is electronically connected to the self-capacitive electrode 10 via a second via hole 104 to decrease the resistance of the self-capacitive electrode. As shown in FIG. 7, in a direction perpendicular to the array substrate, projections of the auxiliary electrode lines 103 disposed on different self-capacitive electrodes 10 are discontinuous line segments. That is, the auxiliary electrode lines 103 on different self-capacitive electrodes 10 are separated from each other.

In order to avoid the problem that streaks visible to human eyes occurs due to a large number or high density of the second via holes 104, in the direction perpendicular to the array substrate, projections of two adjacent second via holes 104 electronically connected to a same auxiliary electrode line 103 are separated by a projection of at least two pixel units. That is, in the direction in which the auxiliary electrode line 103 extends, two adjacent second via holes 104 are separated by at least two pixel units, thereby reducing the number and density of the second via holes 104.

Further, in the direction perpendicular to the array substrate, projections of two adjacent second via holes 104 electronically connected to the same auxiliary electrode line 103 are separated by the projection of eight pixel units. That is, in the direction in which the auxiliary electrode line 103 extends, two adjacent second via holes 104 are separated by eight pixel units.

Optionally, in other embodiments of the disclosure, the problem that streaks visible to human eyes occurs in screen display may be solved by distributing uniformly the first via holes 102 and the second via holes 104. For example, auxiliary electrode lines 103 are distributed uniformly on the self-capacitive electrodes 10, and touch leads 10 are distributed uniformly between the auxiliary electrode lines 103. In this way, the first via holes 102 and the second via holes 104 are distributed uniformly and the number of the first via holes 102 and the second via holes 104 are decreased, so that the problem that streaks visible to human eyes occurs may be solved.

According to the array substrate provided in the embodiment, the touch lead is electronically connected to the self-capacitive electrode corresponding to the touch lead via the first via hole. The auxiliary electrode line is electronically connected to the self-capacitive electrode via a second via hole to decrease the resistance of the self-capacitive electrode. At least one of the touch leads is continuous and passes through the common electrode layer. In the direction perpendicular to the array substrate, two adjacent first via holes are separated by at least two pixel units, and two adjacent second via holes are separated by at least two pixel units. In this way, the problem that streaks or black spots visible to human eyes occurs in screen display due to a large number or high density of the via holes is solved by decreasing the number and density of the first via holes and the second via holes.

It is also provided according to the embodiment of the disclosure a touch display panel including any one of the above array substrates.

It is also provided according to the embodiment of the disclosure a touch display device including the above touch display panels.

According to the touch display panel and the touch display device provided in the embodiment, in the direction perpendicular to the array substrate, the projection of one first via hole is covered by at least the projections of two pixel units. In this way, the problem that streaks visible to human eyes occurs in screen display due to a large number or high density of the first via holes is solved by reducing the number and density of the first via holes.

The embodiments of the present invention are described herein in a progressive manner, with the emphasis of each of the embodiments on the difference between it and the other embodiments; hence, for the same or similar parts between the embodiments, one can refer to various embodiments. The description of the embodiments herein enables those skilled in the art to implement or use the present invention. Numerous modifications to the embodiments will be obvious to those skilled in the art, and the general principle herein can be implemented in other embodiments without deviation from the essence or scope of the present invention. Therefore, the present invention will not be limited to the embodiments described herein, but in accordance with the widest scope consistent with the principle and novel features disclosed herein.

What is claimed is:

1. An array substrate, comprising:
   a plurality of pixel units each comprising a thin film transistor (TFT);
   a common electrode layer disposed over the plurality of pixel units, wherein the common electrode layer is divided into a plurality of columns of self-capacitive electrodes, wherein each self-capacitive electrode overlaps more than one pixel units along the column way;
   a drive circuit; and
   a plurality of touch leads electrically connected to the drive circuit, wherein each of the plurality of touch leads is disposed over one of the columns of the self-capacitive electrodes, and each is connected with only one of the self-capacitive electrodes in the said column through at least two first via holes, wherein two adjacent first via holes in the column way cross over at least two pixel units, and wherein, within the same self-capacitive electrode, the first via holes on one touch lead are aligned staggered to the first via holes on an adjacent touch lead.

2. The array substrate according to claim 1, wherein the touch leads are all continuous and pass through the whole column of the self-capacitive electrodes.

3. The array substrate according to claim 2, further comprising a plurality of auxiliary electrode lines each connecting electrically to the one said self-capacitive electrode via a plurality of second via holes, wherein each of the auxiliary electrode lines overlaps with only one of the self-capacitive electrodes.

4. The array substrate according to claim 1, further comprising a plurality of auxiliary electrode lines each connecting electrically to the one said self-capacitive electrode via a plurality of second via holes, wherein each of the auxiliary electrode lines overlaps with only one of the self-capacitive electrodes.

5. The array substrate according to claim 4, wherein two adjacent second via holes cross over at least two pixel units.

6. The array substrate according to claim 4, wherein the first via holes and the second via holes are distributed uniformly on the self-capacitive electrodes.

7. The array substrate according to claim 6, wherein the auxiliary electrode lines are distributed uniformly on the self-capacitive electrodes, and wherein the touch leads are distributed uniformly between the auxiliary electrode lines.

8. The array substrate according to claim 1, further comprising a plurality of pixel electrodes, wherein the touch leads are in a same layer as the pixel electrodes.

9. The array substrate according to claim 8, wherein:
A) the pixel electrodes are between the common electrode layer and a substrate of the array substrate; or
B) the common electrode layer is between the pixel electrodes and a substrate of the array substrate.

10. The array substrate according to claim 5, wherein the two adjacent first via holes cross over 8 pixel units, wherein the two adjacent second via holes on the same auxiliary electrode line cross over 8 pixel units.

11. A touch display panel comprising an array substrate, wherein the array substrate comprises:
a plurality of pixel units each comprising a thin film transistor (TFT);
a common electrode layer disposed over the plurality of pixel units, wherein the common electrode layer is divided into a plurality of columns of self-capacitive electrodes, wherein each self-capacitive electrode overlaps more than one pixel units along the column way;
a drive circuit; and
a plurality of touch leads electrically connected to the drive circuit, wherein each of the plurality of touch leads is disposed over one of the columns of the self-capacitive electrodes, and each is connected with only one of the self-capacitive electrodes in the said column through at least two first via holes, wherein two adjacent first via holes in the column way cross over at least two pixel units, and wherein, within the same self-capacitive electrode, the first via holes on one touch lead are aligned staggered to the first via holes on an adjacent touch lead.

12. A touch display device comprising a touch display panel comprising an array substrate, wherein the array substrate comprises:
a plurality of pixel units each comprising a thin film transistor (TFT);
a common electrode layer disposed over the plurality of pixel units, wherein the common electrode layer is divided into a plurality of columns of self-capacitive electrodes, wherein each self-capacitive electrode overlaps more than one pixel units along the column way;
a drive circuit; and
a plurality of touch leads electrically connected to the drive circuit, wherein each of the plurality of touch leads is disposed over one of the columns of the self-capacitive electrodes, and each is connected with only one of the self-capacitive electrodes in the said column through at least two first via holes, wherein two adjacent first via holes in the column way cross over at least two pixel units, and wherein, within the same self-capacitive electrode, the first via holes on one touch lead are aligned staggered to the first via holes on an adjacent touch lead.

* * * * *